(12) United States Patent
Wang et al.

(10) Patent No.: US 12,271,084 B2
(45) Date of Patent: Apr. 8, 2025

(54) ARRAY SUBSTRATE, METHOD FOR MANUFACTURING THE SAME AND DISPLAY DEVICE

(71) Applicants: FUZHOU BOE OPTOELECTRONICS TECHNOLOGY CO., LTD., Fujian (CN); BOE TECHNOLOGY GROUP CO., LTD., Beijing (CN)

(72) Inventors: Jinliang Wang, Beijing (CN); Jixiang Chen, Beijing (CN); Wenchao Wang, Beijing (CN); Sangjin Park, Beijing (CN)

(73) Assignees: FUZHOU BOE OPTOELECTRONICS TECHNOLOGY CO., LTD., Fujian (CN); BOE TECHNOLOGY GROUP CO., LTD., Beijing (CN)

( * ) Notice: Subject to any disclaimer, the term of this patent is extended or adjusted under 35 U.S.C. 154(b) by 944 days.

(21) Appl. No.: 17/418,441

(22) PCT Filed: Sep. 30, 2020

(86) PCT No.: PCT/CN2020/119516
§ 371 (c)(1),
(2) Date: Jun. 25, 2021

(87) PCT Pub. No.: WO2022/067711
PCT Pub. Date: Apr. 7, 2022

(65) Prior Publication Data
US 2022/0308408 A1    Sep. 29, 2022

(51) Int. Cl.
*H01L 27/00* (2006.01)
*G02F 1/1335* (2006.01)
(Continued)

(52) U.S. Cl.
CPC .. *G02F 1/136209* (2013.01); *G02F 1/133512* (2013.01); *G02F 1/136231* (2021.01);
(Continued)

(58) Field of Classification Search
CPC ........... G02F 1/133512; G02F 1/13439; G02F 1/136209; G02F 1/136231; H01L 27/1259; H01L 27/127
See application file for complete search history.

(56) References Cited

U.S. PATENT DOCUMENTS

2016/0282646 A1* 9/2016 Liu ................... G02F 1/133753
2019/0019815 A1* 1/2019 Wang ................ G02F 1/136213
2019/0115374 A1* 4/2019 Wu ....................... H01L 27/1259

FOREIGN PATENT DOCUMENTS

CN    102707504 A    10/2012
CN    106950747 A     7/2017
(Continued)

OTHER PUBLICATIONS

"Away." Merriam-Webster.com. 2024. https://www.merriam-webster.com (Jun. 7, 2024). (Year: 2024).*
(Continued)

*Primary Examiner* — Reema Patel
(74) *Attorney, Agent, or Firm* — BROOKS KUSHMAN P.C.

(57) ABSTRACT

An array substrate, a method for manufacturing the array substrate and a display device. The array substrate includes: a base substrate including a display region and a peripheral region surrounding the display region; and a light-leakage protection film layer formed on the base substrate. The light-leakage protection film layer is arranged at the peripheral region and includes at least one first film layer, a light transmittance of each first film layer is smaller than or equal (Continued)

to a first threshold, and reflectivity of the first film layer is smaller than or equal to a second threshold.

20 Claims, 9 Drawing Sheets

(51) Int. Cl.
*G02F 1/1362* (2006.01)
*G02F 1/1343* (2006.01)
*G02F 1/1368* (2006.01)
*H01L 27/12* (2006.01)

(52) U.S. Cl.
CPC .... *G02F 1/13439* (2013.01); *G02F 1/136295* (2021.01); *G02F 1/1368* (2013.01); *H01L 27/124* (2013.01); *H01L 27/127* (2013.01)

(56) References Cited

FOREIGN PATENT DOCUMENTS

| | | | | |
|---|---|---|---|---|
| JP | 2017083678 A | 5/2017 | | |
| KR | 20060058466 A | 5/2006 | | |
| KR | 20130018056 A | * | 2/2013 | ........... G02F 1/1333 |

OTHER PUBLICATIONS

"Close." Merriam-Webster.com. 2024. https://www.merriam-webster.com (Jun. 7, 2024). (Year: 2024).*

* cited by examiner

ARRAY SUBSTRATE, METHOD FOR MANUFACTURING THE SAME AND DISPLAY DEVICE

CROSS-REFERENCE TO RELATED APPLICATION

This application is the U.S. national phase of PCT Application No. PCT/CN2020/119516 filed on Sep. 30, 2020, which is incorporated herein by reference in its entirety.

TECHNICAL FIELD

The present disclosure relates to the field of display technology, in particular to an array substrate, a method for manufacturing the array substrate and a display device.

BACKGROUND

In the related art, a liquid crystal display panel mainly includes a color film substrate and an array substrate arranged opposite to each other to form a liquid crystal cell, and a black matrix is arranged on the color film substrate. In order to prevent liquid crystals from being deflected abnormally and thereby prevent the occurrence of a display defect when static charges generated during the cutting of the color film substrate are transferred from the black matrix exposed at an edge of a screen into the liquid crystal cell, usually a blank region is reserved at a periphery of the black matrix. In this way, it is able to separate a peripheral portion of the black matrix from a central portion of the black matrix, and interrupt a transfer path of the static charges, thereby to prevent the static charges from being transferred into the liquid crystal cell.

SUMMARY

In one aspect, the present disclosure provides in some embodiments an array substrate, including: a base substrate including a display region and a peripheral region surrounding the display region; and a light-leakage protection film layer formed on the base substrate. The light-leakage protection film layer is arranged at the peripheral region and includes at least one first film layer, a light transmittance of each first film layer is smaller than or equal to a first threshold, and reflectivity of the first film layer is smaller than or equal to a second threshold.

In a possible embodiment of the present disclosure, a plurality of second film layers is arranged at the display region, a light transmittance of each second film layer is smaller than or equal to the first threshold, reflectivity of the second film layer is smaller than or equal to the second threshold, and the at least one first film layer in the light-leakage protection film layer is arranged at a same layer, and made of a same material, as the second film layer.

In a possible embodiment of the present disclosure, the plurality of second film layers includes at least one of an active layer and an Indium Tin Oxide (ITO) layer, and at least one first film layer in the light-leakage protection film layer is a light-leakage protection active layer arranged at a same layer, and made of a same material, as the active layer, and/or at least one first film layer in the light-leakage protection film layer is a light-leakage protection ITO layer arranged at a same layer, and made of a same material, as the ITO layer.

In a possible embodiment of the present disclosure, the ITO layer at the display region includes a pixel electrode pattern, and at least one light-leakage protection ITO layer in the light-leakage protection film layer is arranged at a same layer, and made of a same material, as the pixel electrode pattern.

In a possible embodiment of the present disclosure, a buffer layer and an insulation layer are arranged on the base substrate, and the buffer layer, the light-leakage protection active layer, the insulation layer and the light-leakage protection ITO layer are laminated one on another from a side close to the base substrate to a side away from the base substrate.

In a possible embodiment of the present disclosure, an insulation layer is further arranged on the base substrate, a portion of the insulation layer at the peripheral region is arranged between two adjacent first film layers, a plurality of grooves is formed in a side surface of the portion of the insulation layer at the peripheral region away from the base substrate, and the first film layer at a side of the insulation layer away from the base substrate covers each groove in a shape-following manner.

In a possible embodiment of the present disclosure, the grooves are arranged at the peripheral region in an array form, and a minimum distance c between boundaries of two adjacent grooves is smaller than an inner diameter b of the groove.

In a possible embodiment of the present disclosure, the minimum distance c between the boundaries of the two adjacent grooves is greater than or equal to 4 μm, and the inner diameter b of the groove is greater than or equal to 5.5 μm.

In a possible embodiment of the present disclosure, an orthogonal projection of each groove onto the base substrate is of a square shape, a circular shape, a triangular shape or a hexagonal shape.

In a possible embodiment of the present disclosure, the array substrate further includes a detection metal line arranged at the peripheral region, and the light-leakage protection film layer is arranged at a side of the detection metal line away from the base substrate to prevent the detection metal line from reflecting light.

In another aspect, the present disclosure provides in some embodiments a display device, including the above-mentioned array substrate, and a color film substrate arranged opposite to the array substrate to form a cell. A black matrix is arranged on the color film substrate and provided with a hollowed-out region at a position corresponding to the peripheral region.

In a possible embodiment of the present disclosure, a black matrix mosaic pattern is arranged at the hollowed-out region and includes a plurality of regular or irregular mosaic blocks arranged in an array form, and two adjacent rows of mosaic blocks are arranged in a staggered manner.

In a possible embodiment of the present disclosure, a gap a between the between mosaic blocks is greater than the inner diameter b of the groove.

In yet another aspect, the present disclosure provides in some embodiments a method for manufacturing an array substrate, including: providing a base substrate, the base substrate including a display region and a peripheral region surrounding the display region; and forming a light-leakage protection film layer on the base substrate. The light-leakage protection film layer is arranged at the peripheral region and includes at least one first film layer, a light transmittance of each first film layer is smaller than or equal to a first threshold, and reflectivity of the first film layer is smaller than or equal to a second threshold.

In a possible embodiment of the present disclosure, a plurality of second film layers is arranged at the display region, a light transmittance of each second film layer is smaller than or equal to the first threshold, and reflectivity of the second film layer is smaller than or equal to the second threshold. The forming the light-leakage protection film layer on the base substrate includes forming the second film layers and the first film layers on the base substrate through a single patterning process.

DETAILED DESCRIPTION

Figure 1:
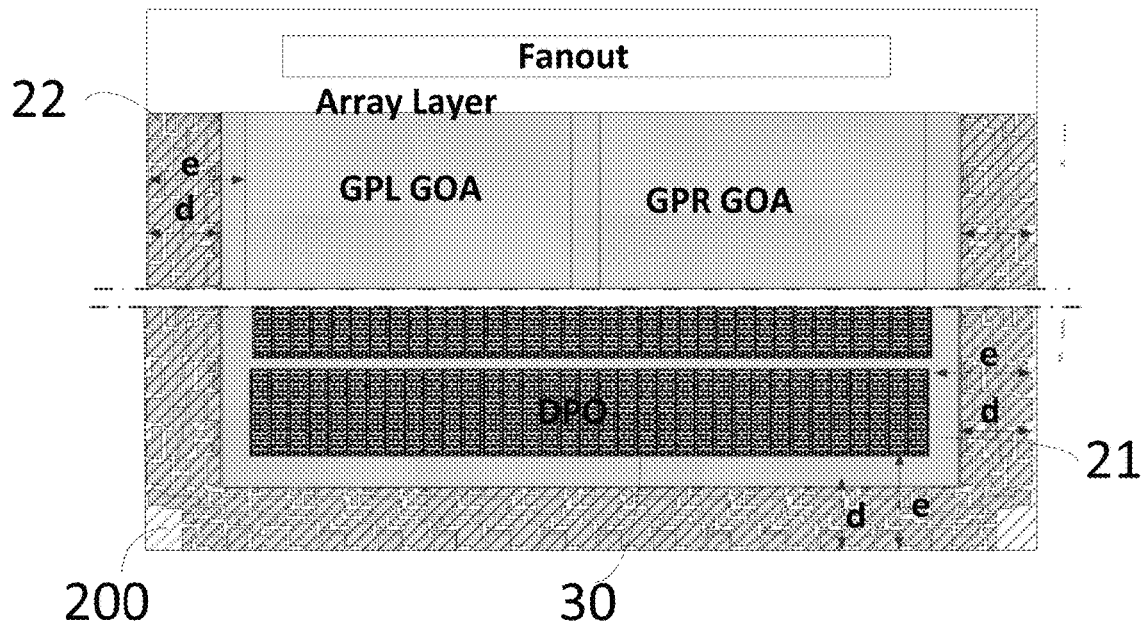
FIG. 1 is a top view showing a part of a display panel with a color film substrate and an array substrate arranged opposite to each other to form a cell in a display device according to one embodiment of the present disclosure.
Figure 2:
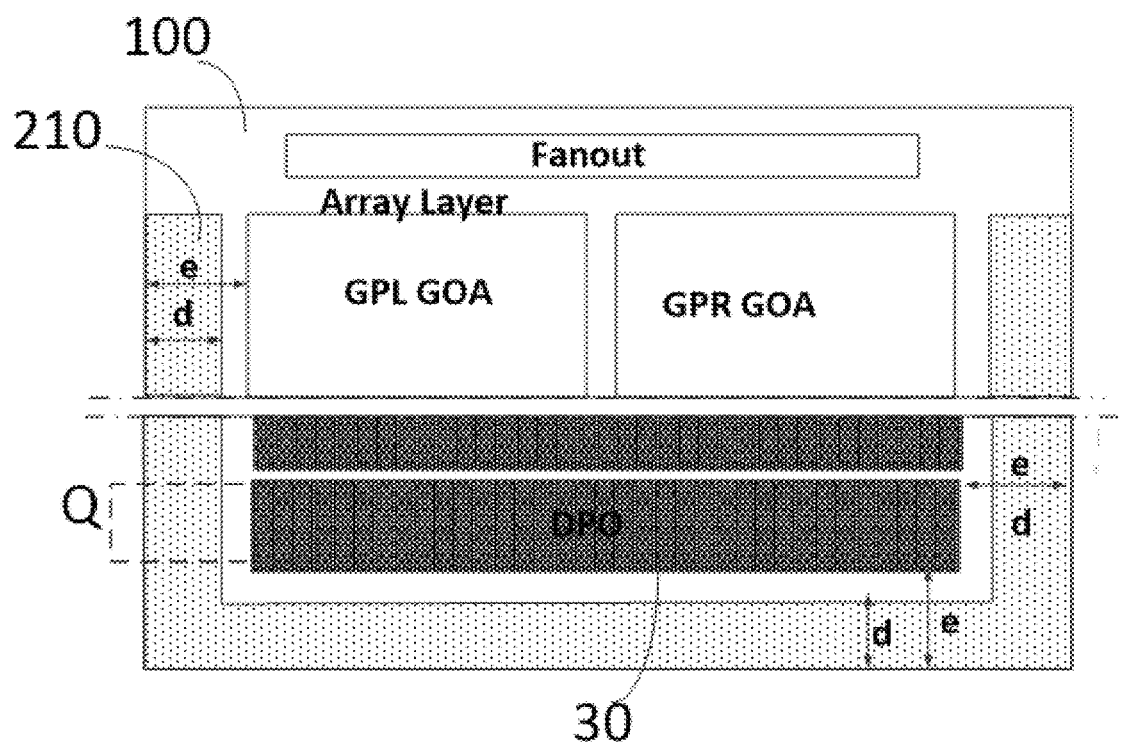
FIG. 2 is a top view showing a part of the array substrate according to one embodiment of the present disclosure.
Figure 3:
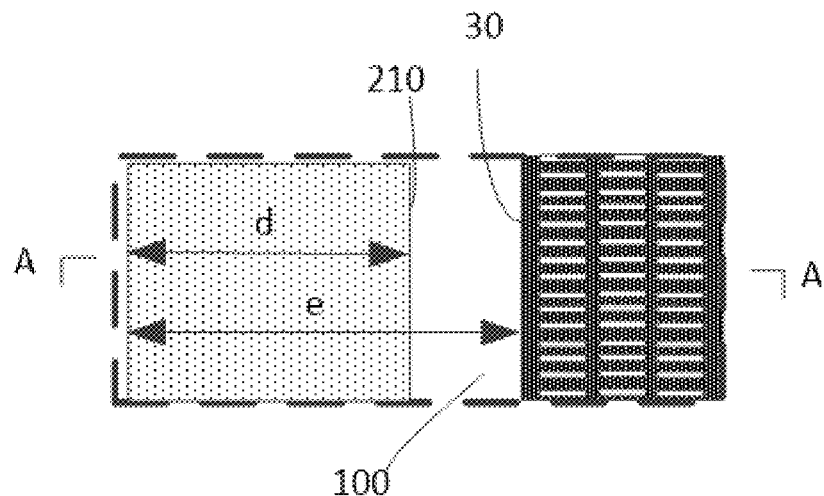
FIG. 3 is a partially enlarged view of a portion Q in FIG. 2.
Figure 4:
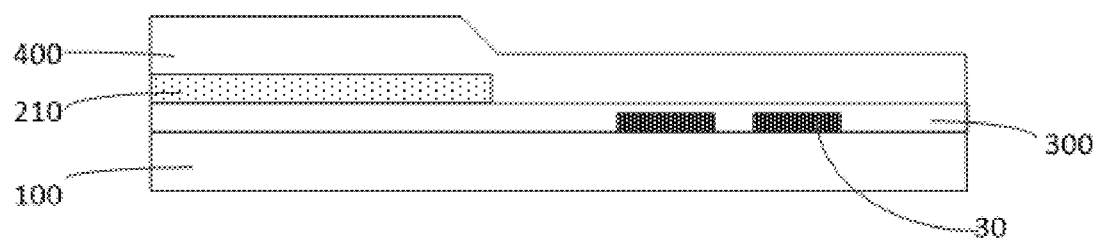
FIG. 4 is a sectional view of the portion Q in FIG. 3 along line A-A.
Figure 5:
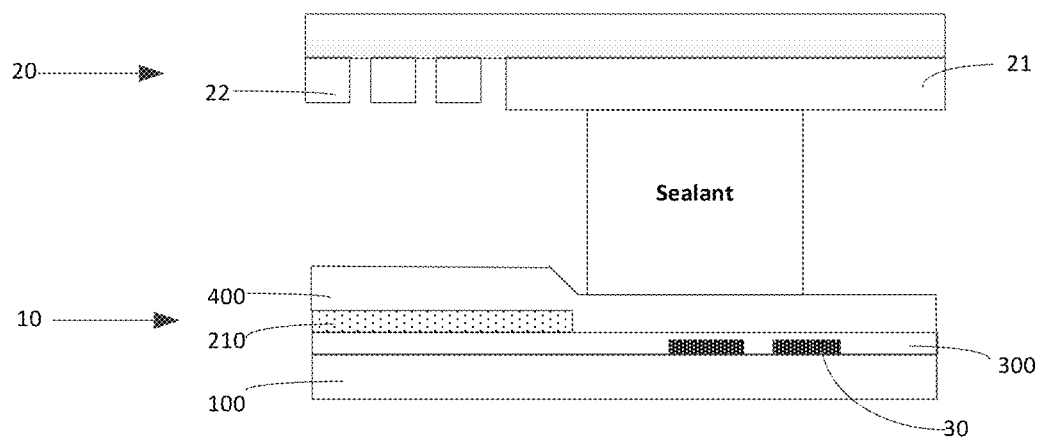
FIG. 5 is a sectional view of the display panel after the array substrate in FIG. 2 is arranged opposite to the color film substrate to form the cell.
Figure 6:
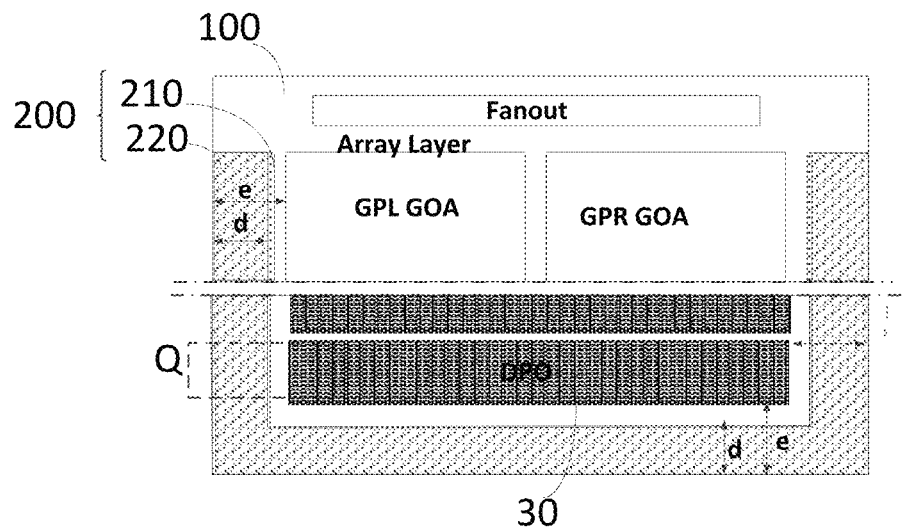
FIG. 6 is another top view showing a part of the array substrate according to one embodiment of the present disclosure.
Figure 7:
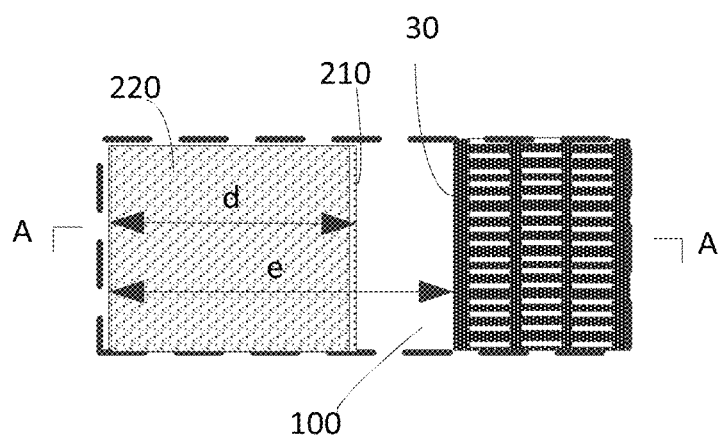
FIG. 7 is a partially enlarged view of a portion Q in FIG. 6.
Figure 8:
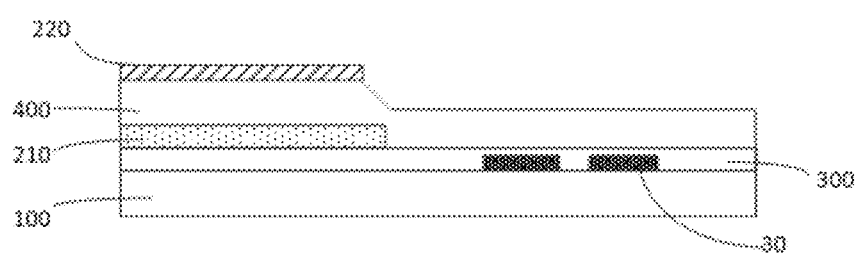
FIG. 8 is a sectional view of the portion Q in FIG. 7 along line A-A.

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

In the embodiments of the present disclosure, it should be appreciated that, such words as "in the middle of", "on/above", "under/below", "left", "right", "vertical", "horizontal", "inside" and "outside" may be used to indicate directions or positions as viewed in the drawings, and they are merely used to facilitate the description in the present disclosure, rather than to indicate or imply that a device or member must be arranged or operated at a specific position. In addition, such words as "first", "second" and "third" may be merely used to differentiate different components rather than to indicate or imply any importance.

Prior to describing in detail an array substrate, a method for manufacturing the array substrate and a display device in the embodiments of the present disclosure, it is necessary to provide the following explanations in the related art.

In the related art, quality of a borderless display product is adversely affected by peripheral light leakage. Taking a liquid crystal display product as an example, there are the following two reasons for the peripheral light leakage.

For the first reason, in order to prevent liquid crystals from being deflected abnormally and thereby prevent the occurrence of a display defect when static charges generated during the cutting of a color film substrate are transferred from a black matrix exposed at an edge of a screen into a liquid crystal cell, usually grooves are formed at a peripheral region for the black matrix, i.e., a blank region (with a width d of about 0.2 mm to 0.3 mm) is reserved at the peripheral region of the color film substrate for the black matrix. In this way, it is able to separate a peripheral portion of the black matrix from a central portion of the black matrix, and interrupt a transfer path of the static charges, thereby to prevent the static charges from being transferred into the liquid crystal cell. Meanwhile, in order to prevent the occurrence of a cutting error and Electronic Static Discharge (ESD), there is a certain distance e (which is usually greater than d) between an array signal on an array substrate and the edge of the screen. In other words, there is a blank region, i.e., a Gate On Array (GOA)-free region, at the peripheral region for the signal line. Usually, the borderless product is borderless at three sides, and no change is made to a Display Port (DP) side, so a fanout region may not be adversely affected. Because the array substrate is not shielded at the peripheral region and the color film substrate is provided with the blank region for the black matrix at the peripheral region, a large quantity of light may leak out at the edge of the screen, and thereby a white side may occur visually.

For the second reason, in the case of relatively high substrate utilization, in order to prevent the occurrence of the cutting error and the ESD, the substrate may be cut into screens exactly in a zero-error manner, and a detection metal line (AT metal line) on the array substrate may enter an interior of the screen and may be arranged at the peripheral region. Due to light reflected by metal, a bright edge may occur.

In order to prevent the occurrence of the peripheral light leakage for the display product, in the related art, a BM mosaic pattern is arranged at the blank region surrounding the black matrix. Although it is able to reduce the peripheral light leakage, the light leakage still exists due to a gap in the BM mosaic pattern, thereby a grey side may occur visually. In addition, in the case that the detection metal line is arranged at the peripheral region, generally the edge of the screen may look grey even with the BM mosaic pattern, i.e., there is still a difference between the edge of the screen and a black matrix region. Hence, how to reduce a level of the peripheral light leakage for the screen is the key to the improvement in the appearance quality of the borderless display product.

An object of the present disclosure is to provide an array substrate, a manufacturing method thereof and a display device, so as to mitigate the peripheral light leakage for the borderless display product.

As shown in FIGS. 1 to 19, the present disclosure provides in some embodiments an array substrate, which includes: a base substrate 100 including a display region (active area AA) and a peripheral region (area B) surrounding the display region; and a light-leakage protection film layer 200 formed on the base substrate 100. The light-leakage protection film layer 200 is arranged at the peripheral region and includes at least one first film layer, a light transmittance of each first film layer is smaller than or equal to a first threshold, and reflectivity of the first film layer is smaller than or equal to a second threshold.

In the embodiments of the present disclosure, the first film layer may be a film layer whose light transmittance is smaller than or equal to the first threshold and whose reflectivity is smaller than or equal to the second threshold. When the light transmittance is smaller than or equal to the first threshold, it means that the first film layer is capable of reducing the quantity of light passing therethrough. For example, when the first threshold is 94%, the first film layer may be just a film layer whose light transmittance is smaller than or equal to 94%. Identically, when the reflectivity is smaller than or equal to the second threshold, it means that the first film layer is a film layer having small reflectivity so as to prevent the occurrence of peripheral light leakage due to reflection of light. For example, the second threshold may be smaller than reflectivity of metal.

According to the array substrate in the embodiments of the present disclosure, the light-leakage protection film layer 200 may be arranged at the peripheral region of the array substrate and include one or more first film layers. As a result, it is able to reduce the quantity of light passing through the light-leakage protection film layer, thereby to reduce a peripheral light leakage level for a screen.

Usually, all or parts of film layers of a driving circuitry layer (an array pattern layer) and a display layer (including a pixel electrode and/or a common electrode) are arranged on the array substrate.

In some embodiments of the present disclosure, a plurality of second film layers may be arranged at the display region, and serves as the driving circuitry layer (the array pattern layer) and all or parts of film layers of the display layer (including the pixel electrode and/or the common electrode). In FIG. 1, 30 represents the driving circuitry layer and the display layer. In addition, a light transmittance of the second film layer may be smaller than or equal to the first threshold, and reflectivity of the second film layer may be smaller than or equal to the second threshold. At least one first film layer in the light-leakage protection film layer 200 may be arranged at a same layer, and made of a same material, as the second film layer.

In other words, in the array substrate according to the embodiments of the present disclosure, the light-leakage protection film layer 200 may be formed directly using the film layer at the display region whose light transmittance and reflectivity meet the requirements, i.e., the second film layers. As a result, during the manufacture of the array substrate, the first film layer may be formed through a same patterning process through a mask for forming the second film layer, so it is able to simplify the manufacture process and reduce the manufacture cost.

At the display region of the array substrate, the driving circuitry layer may include a thin film transistor (TFT). An active layer of the TFT may include yellowish microcrystals which may reduce the light transmittance and whose reflectivity is smaller than the second threshold (e.g., smaller than the reflectivity of metal). Hence, in some embodiments of the present disclosure, as shown in FIGS. 2 to 5, the second film layer at the display region may be the active layer, and at least one first film layer may be a light-leakage protection active layer 210 arranged at a same layer, and made of a same material, as the active layer. In other words, the light-leakage protection film layer 200 may be formed at the peripheral region by means of the active layer.

In addition, at the display region of the array substrate, the display layer may include an ITO layer, and for example, the ITO layer may serve as a pixel electrode. A light transmittance of the ITO layer may be smaller than or equal to the first threshold (e.g., 94%) rather than 100%, and reflectivity of the ITO layer may be smaller than the second threshold (e.g., smaller than the reflectivity of metal), so as to reduce the light transmittance. Hence, in some embodiments of the present disclosure, as shown in FIGS. 10 to 13, the second film layer at the display region may be the ITO layer, the at least one first film layer may be a light-leakage protection ITO layer 220 arranged at a same layer, and made of a same material, as the ITO layer, i.e., the light-leakage protection film layer 200 may be formed at the peripheral region by means of the ITO layer.

In addition, in some embodiments of the present disclosure, as shown in FIGS. 6 to 9, the light-leakage protection film layer 200 may include not only the light-leakage protection active layer 210 but also the light-leakage protection ITO layer 220, so as to further reduce the light transmittance and mitigate the peripheral light leakage.

In addition, there may exist merely one active layer at the display region, and at this time the light-leakage protection film layer 200 may include one light-leakage protection active layer 210. There may also exist at least two active layers at the display region, and at this time the light-leakage protection film layer 200 may include one or more light-leakage protection active layers 210, and the light-leakage protection active layers 210 may be laminated in a same order as the active layers at the display region.

In addition, there may exist one or more ITO layers at the display region, and at this time the light-leakage protection film layer 200 may include one light-leakage protection ITO layer 220. There may also exist at least two ITO layers at the display region, and at this time the light-leakage protection film layer 200 may include one or more light-leakage protection ITO layers, and the light-leakage protection ITO layers 220 may be laminated in a same order as the ITO layers at the display region.

For example, in some embodiments of the present disclosure, the ITO layers at the display region may include a first ITO layer ITO1 and a second ITO layer ITO2. The second ITO layer ITO2 may form a pixel electrode pattern, and at least one light-leakage protection ITO layer 220 in the light-leakage protection film layer 200 may be arranged at a same layer, and made of a same material, as the pixel electrode pattern.

Of course, it should be appreciated that, the above is for an illustrative purpose only, and in practical application, at least one light-leakage protection ITO layer 220 in the light-leakage protection film layer 200 may be arranged at a same layer, and made of a same material, as the first ITO layer ITO1.

Figure 9:
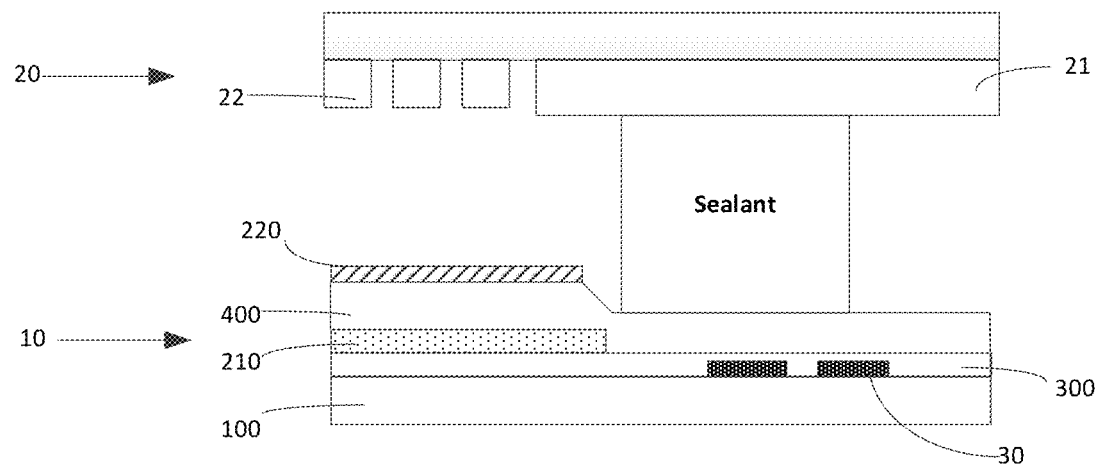
FIG. 9 is a sectional view of the display panel after the array substrate in FIG. 6 is arranged opposite to the color film substrate to form the cell.
Figure 10:
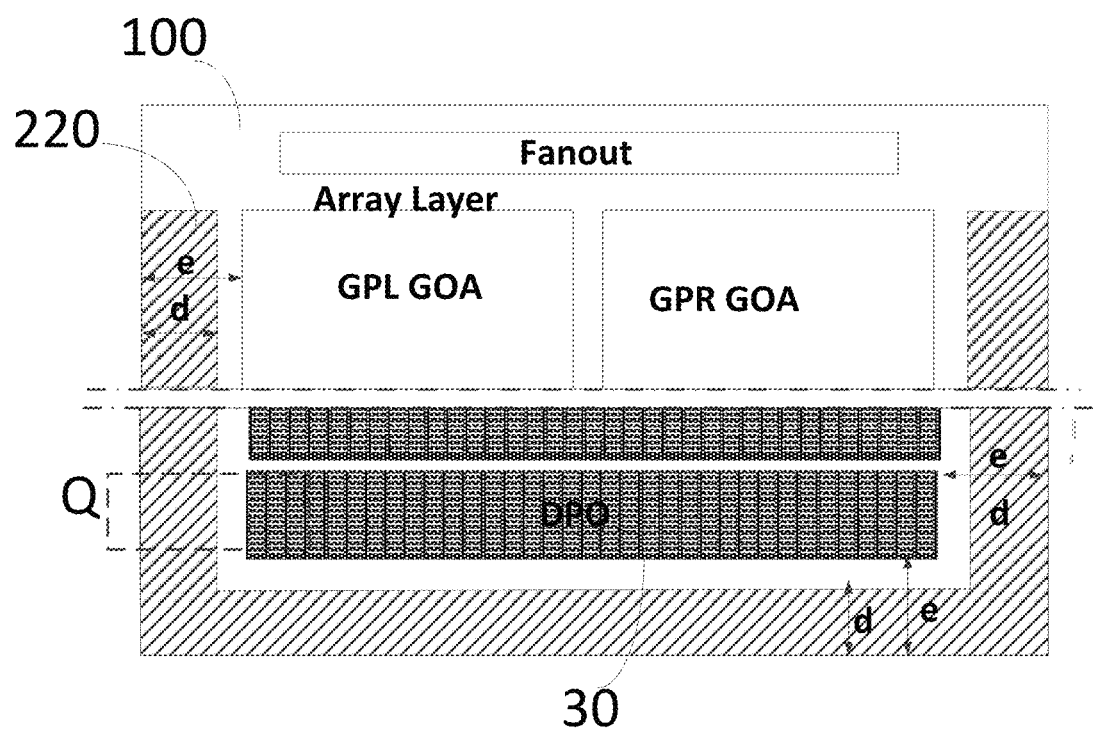
FIG. 10 is yet another top view showing a part of the array substrate according to one embodiment of the present disclosure.
Figure 11:
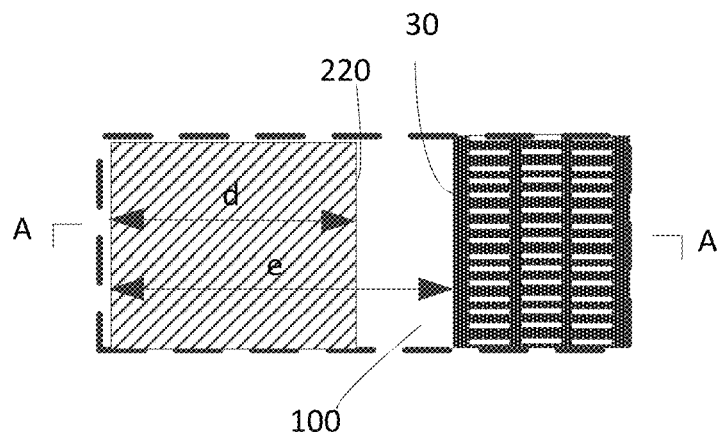
FIG. 11 is a partially enlarged view of a portion Q in FIG. 10.
Figure 12:
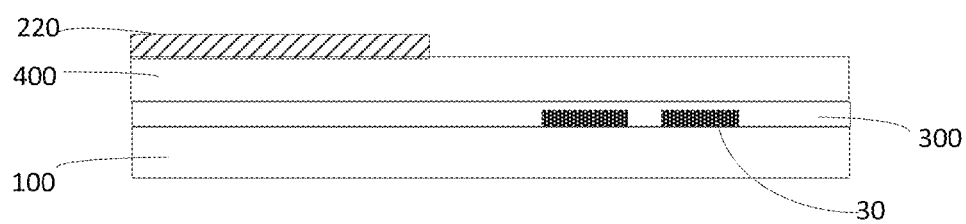
FIG. 12 is a sectional view of the portion Q in FIG. 11 along line A-A.
Figure 13:
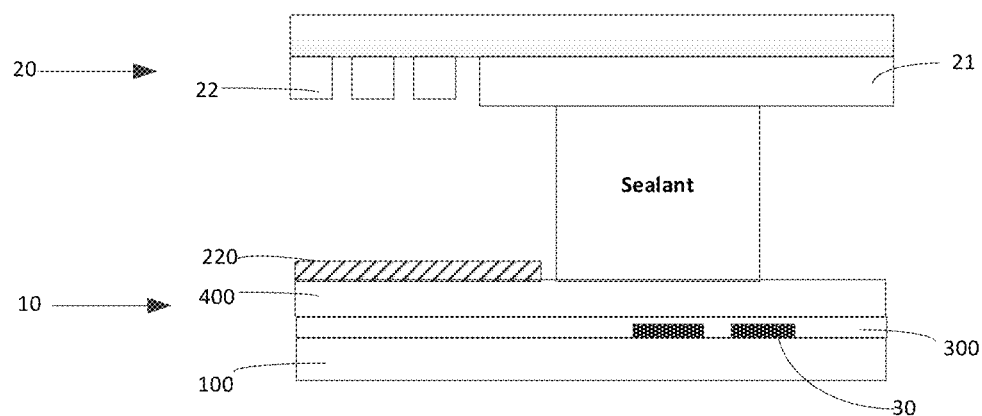
FIG. 13 is a sectional view of the display panel after the array substrate in FIG. 10 is arranged opposite to the color film substrate to form the cell.
Figure 14:
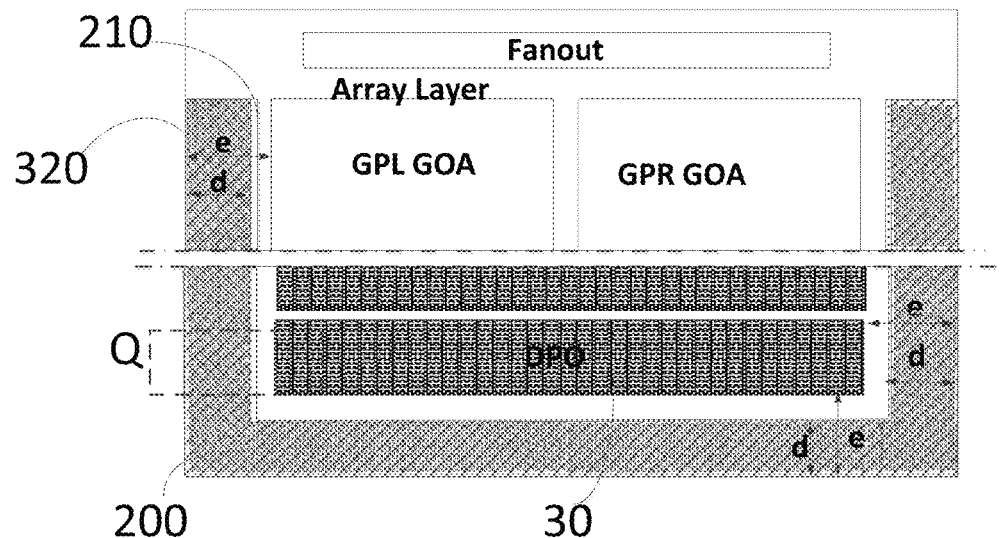
FIG. 14 is still yet another top view showing a part of the array substrate according to one embodiment of the present disclosure.
Figure 15:
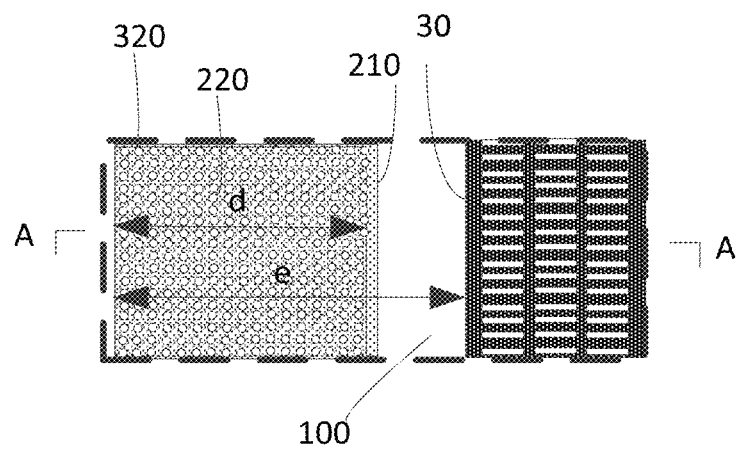
FIG. 15 is a partially enlarged view of a portion Q in FIG. 14.
Figure 16:
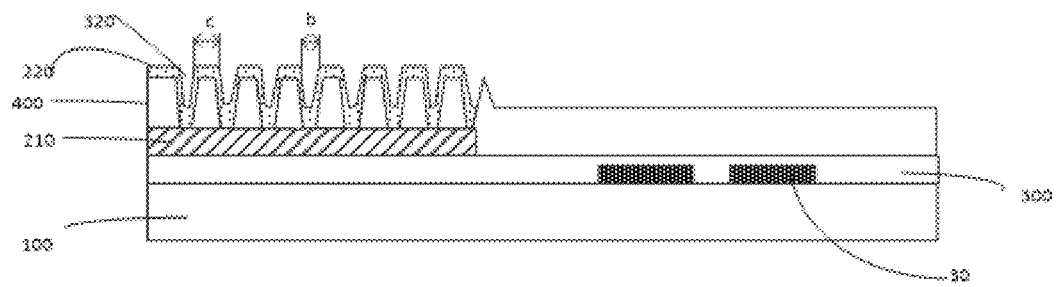
FIG. 16 is a sectional view of the portion Q in FIG. 15 along line A-A.
Figure 17:
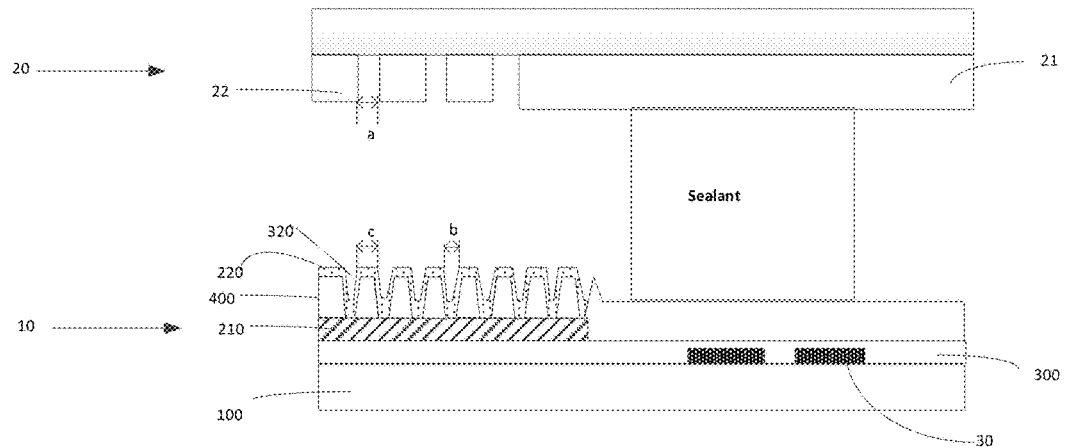
FIG. 17 is a sectional view of the display panel after the array substrate in FIG. 14 is arranged opposite to the color film substrate to form the cell.

In some embodiments of the present disclosure, as shown in FIG. 9, a buffer layer 300 and an insulation layer (PVX) 400 may be further arranged on the base substrate 100 and cover the display region and the peripheral region. At the peripheral region, the buffer layer 300, the light-leakage protection active layer 210, the insulation layer 400 and the light-leakage protection ITO layer 220 may be laminated one on another from a side close to the base substrate 100 to a side away from the base substrate 100.

In some embodiments of the present disclosure, as shown in FIGS. 14 to 17, a portion of the insulation layer 400 at the peripheral region may be arranged between two adjacent first film layers, a plurality of grooves may be formed in a side surface of the portion of the insulation layer 400 at the peripheral region away from the base substrate 100, and the first film layer at a side of the insulation layer 400 away from the base substrate 100 may cover each groove in a shape-following manner to form a light-shielding hole 320.

Based on the above, the plurality of grooves may be formed in the insulation layer 400 at a position corresponding to the peripheral region, and a wall of the light-shielding hole 320 formed after the first film layer covers the groove in a shape-following manner may have such an effect as scattering light (the wall of the light-shielding hole 320 is in a dark color when the groove is viewed through a microscope), so as to further reduce the light transmittance as well as the peripheral light leakage for the screen.

The grooves may be arranged in such a manner as to form small and dense holes as possible, so as to remarkably reduce the light transmittance at the periphery. For example, in some embodiments of the present disclosure, the grooves may be arranged at the peripheral region in an array form, and a minimum distance c between boundaries of two adjacent grooves may be smaller than an inner diameter b of the groove. The minimum distance c between the boundaries of two adjacent grooves may be greater than or equal to 4 μm, and the inner diameter b of the groove may be greater than or equal to 5.5 μm. In this way, it is able for the groove to provide a better effect of reducing the light transmittance. Of course, it should be appreciated that, in practical application, the arrangement of the grooves will not be particularly defined herein.

In addition, for example, an orthogonal projection of each groove onto the base substrate 100 may be of a square shape, a circular shape, a triangular shape or a hexagonal shape. Of course, it should be appreciated that, the above shapes are for illustrative purposes only, and in practical application, a specific shape of the groove will not be particularly defined.

In addition, each groove may be a via-hole penetrating through the insulation layer 400, or a depressed structure formed through etching off merely a part of the insulation layer 400. The groove may be formed through a single patterning process and a same mask while patterning the insulation layer 400 at the display region to form the via-holes, i.e., it is unnecessary to provide any additional mask and additional process. An etching depth of the groove may be controlled through controlling an etching rate and an etching time, and a ramp angle of a side wall of the groove may be determined in accordance with parameters of the groove such as thickness, so as to meet the requirement on the scattering of light.

Figure 18:
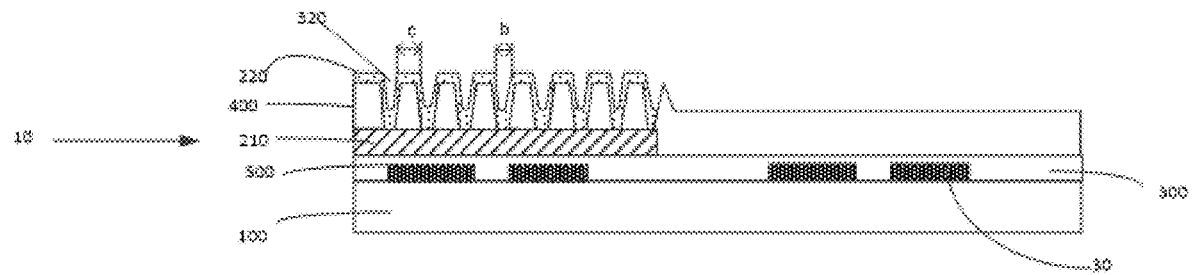
FIG. 18 is a sectional view of the array substrate according to one embodiment of the present disclosure.
Figure 19:
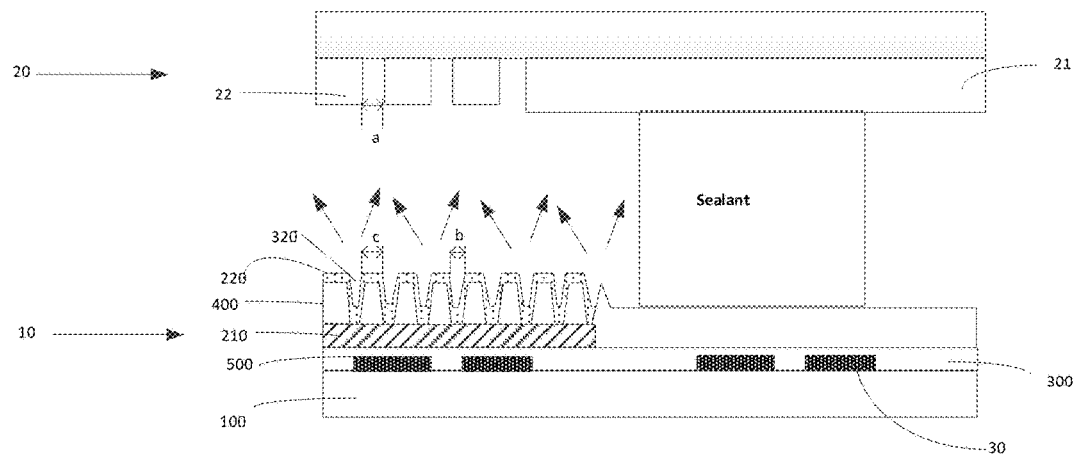
FIG. 19 is a sectional view of the display panel after the array substrate in FIG. 18 is arranged opposite to the color film substrate to form the cell.

In some embodiments of the present disclosure, as shown in FIGS. 18 and 19, the array substrate may further include a detection metal line 500 arranged at the peripheral region, and the light-leakage protection film layer 200 may be arranged at a side of the detection metal line 500 away from the base substrate 100 to prevent the detection metal line 500 from reflecting light.

Based on the above, the array substrate may include the detection metal line 500 (AT metal line) at the peripheral region, and the light-leakage protection film layer 200 may be arranged on the detection metal line 500, so as to prevent the occurrence of a bright edge caused when light is reflected by the detection metal line 500.

In the above embodiments of the present disclosure, during the manufacture of the array substrate, the first film layer may be formed through a single patterning process using a mask for forming the second film layer, as long as an opening is formed in a common mask at a position corresponding to the peripheral region. In this way, it is merely necessary to perform an existing process, without any additional process and additional film layer, and thereby there is no additional manufacture cost.

In addition, it should be appreciated that, when the array substrate in the embodiments of the present disclosure is applied to a liquid crystal display device, the array substrate may be arranged opposite to a color film substrate to from a cell, thereby to form a display panel. A black matrix may be formed on the color film substrate, and provided with a hollowed-out region at a position corresponding to the peripheral region.

In some embodiments of the present disclosure, the hollowed-out region may be a blank region, i.e., no light-shielding pattern may be arranged at the hollowed-out region. In some other embodiments of the present disclosure, a BM mosaic pattern may be arranged at the hollowed-out region and include a plurality of regular or irregular mosaic blocks arranged in an array form, and two adjacent rows of mosaic blocks may be arranged in a staggered manner.

The present disclosure further provides in some embodiments a display device which, as shown in FIGS. 1, 5, 9, 13, 17 and 19, includes the above-mentioned array substrate 10, and a color film substrate 20 arranged opposite to the array substrate 10 to form a cell. A black matrix 21 is arranged on the color film substrate 20 and provided with a hollowed-out region d at a position corresponding to the peripheral region.

The display device may be any product or member having a display function, e.g., a liquid crystal television, a liquid crystal display, a digital photo frame, a mobile phone or a tablet computer. The display device may further include a flexible circuit board, a printed circuit board and a back plate.

In some embodiments of the present disclosure, the hollowed-out region d may be a blank region, i.e., no light-shielding pattern may be arranged at the hollowed-out region d. In some other embodiments of the present disclosure, a BM mosaic pattern 22 may be arranged at the hollowed-out region d and include a plurality of regular or irregular mosaic blocks arranged in an array form, and two adjacent rows of mosaic blocks may be arranged in a staggered manner.

In some embodiments of the present disclosure, a gap between the mosaic blocks may be greater than an inner diameter b of the groove, so it is able for the groove to provide a light scattering effect.

When the color film substrate 20 is provided with the BM mosaic pattern 22 at the hollowed-out region, several samples may be tested at a same backlight brightness value to acquire images through an optical microscope, and the following results will be acquired.

Figure 20:
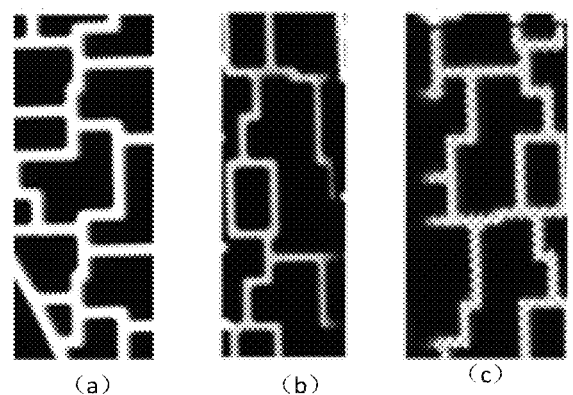
FIG. 20 is a comparison diagram showing images of a sample of the display panel after the array substrate is arranged opposite to the color film substrate to form the cell in the embodiments of the present disclosure and an image of a conventional display panel acquired through an optical microscope.

FIG. 20(a) is a schematic view showing an actual light-transmitting result of a conventional display device. In the conventional display device, the BM mosaic pattern 22 is merely arranged at the hollowed-out region of the black matrix 21 on the color film substrate 20, and no light-leakage protection film layer 200 is arranged on the array substrate 10 at the peripheral region. Based on the result acquired through the microscope, strong white light may pass through the gap between the mosaic blocks of the black matrix 21, so high white/black contrast is provided and a white side or grey side occurs visually.

FIG. 20(b) is a schematic view showing an actual light-transmitting result of the display device in the embodiments of the present disclosure. In the structure of the array substrate 10 of the display device, the BM mosaic pattern 22 is arranged at the hollowed-out region of the black matrix 21 on the color film substrate 20, and the light-leakage protection film layer 200 is arranged on the array substrate 10 at the peripheral region. In addition, the light-leakage protection film layer 200 includes the light-leakage protection active layer 210 and the second ITO layer ITO2, and no groove is formed in the insulation layer 400. Based on the result acquired through the microscope, a color of yellowish appears at the gap between the mosaic blocks of the black matrix 21 when exposed to the black light, i.e., a part of light energy is lost. Because black/yellow contrast is obviously smaller than the black/white contrast, it is able to reduce a brightness value of the white side or grey side.

FIG. 20(c) is another schematic view showing the actual light-transmitting result of the display device in the embodiments of the present disclosure. In the structure of the array substrate 10 of the display device, the BM mosaic pattern 22 is arranged at the hollowed-out region of the black matrix 21 on the color film substrate 20, and the light-leakage protection film layer 200 is arranged on the array substrate 10 at the peripheral region. In addition, the light-leakage protection film layer 200 includes the light-leakage protection active layer 210 and the second ITO layer ITO2, and the grooves are formed in the insulation layer 400. Based on the result acquired through the microscope, a color of grey appears at the gap between the mosaic blocks of the black matrix 21 due to a diffuse reflection effect of the wall of the groove, so it is able to effectively prevent the occurrence of the white side or grey side.

In addition, several samples may be tested at a same backlight brightness value to acquire macroscopic images, and the following results will be acquired.

Figure 21:
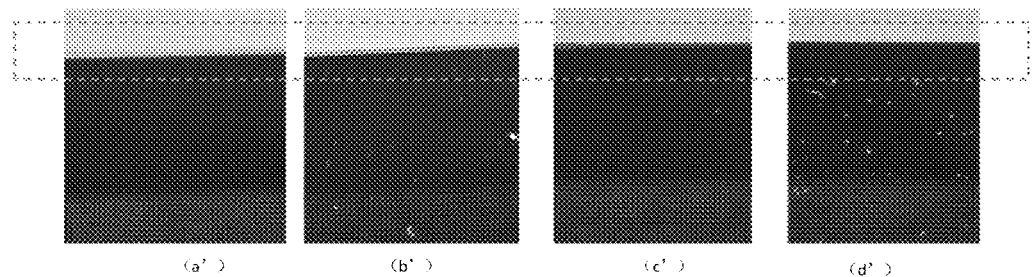
FIG. 21 is a comparison diagram showing macroscopic images of a sample of the display panel after the array substrate is arranged opposite to the color film substrate to form the cell in the embodiments of the present disclosure and a macroscopic image of a conventional display panel.

FIG. 21(a') shows a microscopic image of an edge of a screen of the conventional display device without any BM mosaic pattern 22. Due to the existence of a blank region having a width of 0.2 mm to 0.3 mm at the peripheral region of the color film substrate 20, the edge of the screen looks like a white side visually.

FIG. 21(b') shows a microscopic image of the edge of the screen of the conventional display device with the BM mosaic pattern 22. Due to the BM mosaic pattern 22 of the black matrix 21 at the peripheral region of the color film substrate 20, it is able to slightly mitigate the white side, and the edge of the screen looks like a grey side visually.

FIG. 21(c') shows a microscopic image of an edge of a screen of the display device in the embodiments of the present disclosure. The BM mosaic pattern 22 of the black matrix 21 is arranged at the peripheral region of the color film substrate 20, and the light-leakage protection film layer 200 is arranged at the peripheral region of the array substrate 10, and no groove is formed in the insulation layer 400 at the peripheral region. As compared with FIG. 21(b'), it is able to further mitigate the white side.

FIG. 21(d') shows a microscopic image of the edge of the screen of the display device in the embodiments of the present disclosure. The BM mosaic pattern 22 of the black matrix 21 is arranged at the peripheral region of the color film substrate 20, the light-leakage protection film layer 200 is arranged at the peripheral region of the array substrate 10, and the grooves are formed in the insulation layer 400 at the peripheral region. As compared with FIG. 21(c'), it is able to further mitigate the whit side, and provide a better visual effect.

Based on the above, according to the display substrate and the display device in the embodiments of the present disclosure, as compared with the display device in the related art, it is able to reduce the peripheral light leakage for the screen and mitigate the white side.

The present disclosure further provides in some embodiments a method for manufacturing an array substrate 10, which includes: Step S01 of providing a base substrate 100, the base substrate 100 including a display region and a peripheral region surrounding the display region; and Step S02 of forming a light-leakage protection film layer 200 on the base substrate 100. The light-leakage protection film layer 200 is arranged at the peripheral region and includes at least one first film layer, a light transmittance of each first film layer is smaller than or equal to a first threshold, and reflectivity of the first film layer is smaller than or equal to a second threshold.

For example, a plurality of second film layers may be arranged at the display region, a light transmittance of each second film layer may be smaller than or equal to the first threshold, and reflectivity of the second film layer may be smaller than or equal to the second threshold. Step S02 may include forming the second film layers and the first film layers on the base substrate 100 through a single patterning process.

In some embodiments of the present disclosure, the second film layer may include an active layer, and the first film layer may include a light-leakage protection active layer 210 arranged at a same layer, and made of a same material, as the active layer. Step 02 may specifically include forming the active layer at the display region and the light-leakage protection active layer 210 at the peripheral region through a single patterning process using a same mask.

In some embodiments of the present disclosure, the second film layer may include an ITO layer, and the first film layer may include a light-leakage protection ITO layer 220 arranged at a same layer, and made of a same material, as the ITO layer. Step S02 may specifically include forming the ITO layer at the display region and the light-leakage protection ITO layer 220 at the peripheral region through a single patterning process using a same mask.

In some other embodiments of the present disclosure, a portion of the insulation layer 400 at the peripheral region may be arranged between two adjacent first film layers, a plurality of grooves may be formed in a side surface of the portion of the insulation layer 400 at the peripheral region away from the base substrate 100, and the first film layer at a side of the insulation layer 400 away from the base substrate 100 may cover the groove in a shape-following manner. The method may further include forming a pattern of the insulation layer 400 at the display region and the grooves at the peripheral region through a single patterning process using a same mask.

The method for manufacturing the array substrate 10 will be described hereinafter in more details by taking the array substrate 10 in FIG. 18 as an example. The light-leakage protection film layer 200 at the peripheral region of the array substrate 10 may include the light-leakage protection active layer 210 and the second ITO layer ITO2 laminated one on another from a side close to the base substrate 100 to a side away from the base substrate 100, and the grooves may be formed in the portion of the insulation layer 400 at the peripheral region.

In some embodiments of the present disclosure, the method may include: Step S01 of providing a base substrate 100, the base substrate 100 including a display region and a peripheral region surrounding the display region; and Step S02 of forming a light-leakage protection film layer 200 on the base substrate 100. The light-leakage protection film layer 200 may be arranged at the peripheral region and include at least one first film layer, a light transmittance of each first film layer may be smaller than or equal to a first threshold, and reflectivity of the first film layer may be smaller than or equal to a second threshold.

Figure 22:
FIG. 22 is a schematic view showing Step S021 in a method for manufacturing the array substrate according to one embodiment of the present disclosure.

Step S02 may include the following steps:

Step S021: as shown in FIG. 22, a first ITO layer 30 may be formed through exposing and etching using a first mask (ITO1 mask). The first ITO layer 30 may merely include a first ITO pattern 31 at the display region.

To be specific, the first ITO layer may be formed on the base substrate. Next, a photoresist may be applied onto the first ITO layer, and then exposed using the first mask to form a photoresist reserved region corresponding to a region where the first ITO pattern is located and a photoresist unreserved region corresponding to a region other than the pattern. Next, a developing process may be performed, so as to fully remove the photoresist at the photoresist unreserved region, and maintain a thickness of the photoresist at the photoresist reserved region. Finally, the first ITO layer at the photoresist unreserved region may be fully etched off through an etching process, and the remaining photoresist may be removed, so as to form the first ITO pattern.

Figure 23:
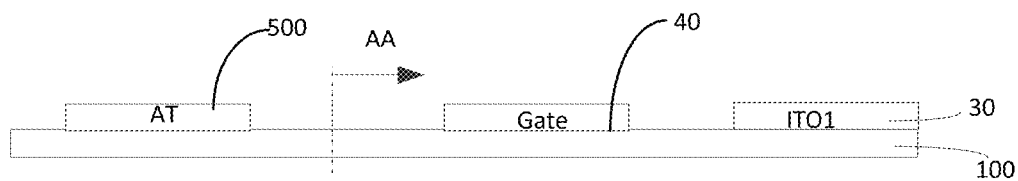
FIG. 23 is a schematic view showing Step S022 in the method for manufacturing the array substrate according to one embodiment of the present disclosure.

Step S022: as shown in FIG. 23, a gate pattern may be formed through exposing and etching using a second mask (gate mask). The gate pattern 40 may include a GOA line and a gate line at the display region. When a detection metal line 500 is arranged at the peripheral region, the gate pattern 40 may further include the detection metal line 500.

To be specific, a gate metal layer having a thickness of about 500 Å to 4000 Å may be deposited onto the base substrate 100 through sputtering or thermal evaporation. The gate metal layer may be made of Cu, Al, Ag, Mo, Cr, Nd, Ni, Mn, Ti, Ta or W, or an alloy thereof, and it may be of a single-layered structure, or a multi-layered structure, e.g., Cu/Mo, Ti/Cu/Ti or Mo/Al/Mo. Next, the gate metal layer may be patterned to form the gate pattern. To be specific, a photoresist may be applied onto the gate metal layer on the base substrate 100, and then exposed using a mask, so as to form a photoresist reserved region corresponding to a region where such patterns as the gate line and a gate electrode are located and a photoresist unreserved region corresponding to a region other than the patterns. Next, a developing process may be performed, so as to fully remove the photoresist at the photoresist unreserved region and maintain a thickness of the photoresist at the photoresist reserved region. Finally, the gate metal layer at the photoresist unreserved region may be fully etched off through an etching process, and the remaining photoresist may be removed, so as to form the patterns such as the gate line and the gate electrode.

Step S023: a buffer layer 300 may be formed at the display region and the peripheral region of the base substrate 100.

To be specific, the buffer layer 300 may be deposited through magnetron sputtering, thermal evaporation, Plasma Enhanced Chemical Vapor Deposition (PECVD) or any other film-forming method. The buffer layer 300 may be made of an oxide, a nitride or an oxynitride. To be specific, the buffer layer may be made of SiNx, SiOx or Si(ON)x. The buffer layer 300 may be of a single-layered structure, or a double-layered structure consisting of SiNx and SiOx. Reactive gases corresponding to SiOx may be $SiH_4$ and $N_2O$, and reactive gases corresponding to the nitride or oxynitride may be $SiH_4$, $NH_3$ and $N_2$, or $SiH_2Cl_2$, $NH_3$ and $N_2$.

Figure 24:
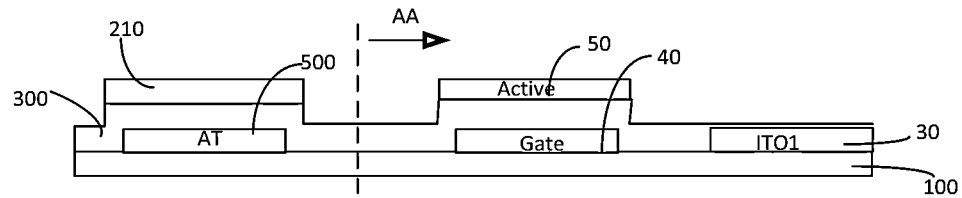
FIG. 24 is a schematic view showing Step S024 in the method for manufacturing the array substrate according to one embodiment of the present disclosure.

Step S024: as shown in FIG. 24, a semiconductor layer 50 at the display region and the light-leakage protection active layer 210 at the peripheral region may be formed through exposing and dry-etching using a third mask (active mask).

To be specific, an active layer may be formed on the base substrate. Next, a photoresist may be applied onto the active layer, and then exposed using the third mask, so as to form a photoresist reserved region corresponding to a region where patterns of the semiconductor layer and the light-leakage protection active layer are located and a photoresist unreserved region corresponding to a region other than the patterns. Then, a developing process may be performed, so as to fully remove the photoresist at the photoresist unreserved region and maintain a thickness of the photoresist at the photoresist reserved region. Finally, the active layer at the photoresist unreserved region may be fully etched off through an etching process, and the remaining photoresist may be removed, so as to form the patterns of the semiconductor layer and the light-leakage protection active layer.

Figure 25:
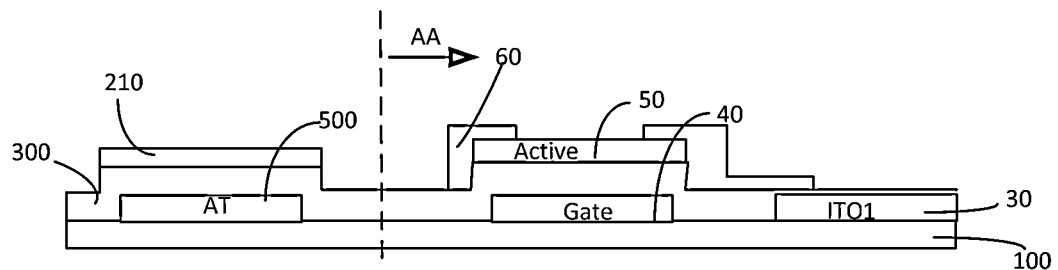
FIG. 25 is a schematic view showing Step S025 in the method for manufacturing the array substrate according to one embodiment of the present disclosure.

Step S025: as shown in FIG. 25, a source/drain metal pattern 60 may be formed through exposing and etching using a fourth mask plate (SD mask).

To be specific, a source/drain metal layer having a thickness of about 2000 Å to 4000 Å may be deposited on the base substrate 100 through magnetron sputtering, thermal evaporation or any other film-forming method. The source/ drain metal layer may be made of Cu, Al, Ag, Mo, Cr, Nd, Ni, Mn, Ti, Ta or W, or an alloy thereof. The source/drain metal layer may be of a single-layered structure, or a multi-layered structure such as Cu/Mo, Ti/Cu/Ti or Mo/Al/Mo. Next, a photoresist may be applied onto the source/drain metal layer, and then exposed using a mask, so as to form a photoresist reserved region corresponding to a region where patterns of a source electrode, a drain electrode and a data line are located and a photoresist unreserved region corresponding a region other than the patterns. Then, a developing process may be performed, so as to fully remove the photoresist at the photoresist unreserved region and maintain a thickness of the photoresist at the photoresist reserved region. Finally, the source/drain metal layer at the photoresist unreserved region may be fully etched off through an etching process, and the remaining photoresist may be removed, so as to form the drain electrode, the source electrode and the data line.

Figure 26:
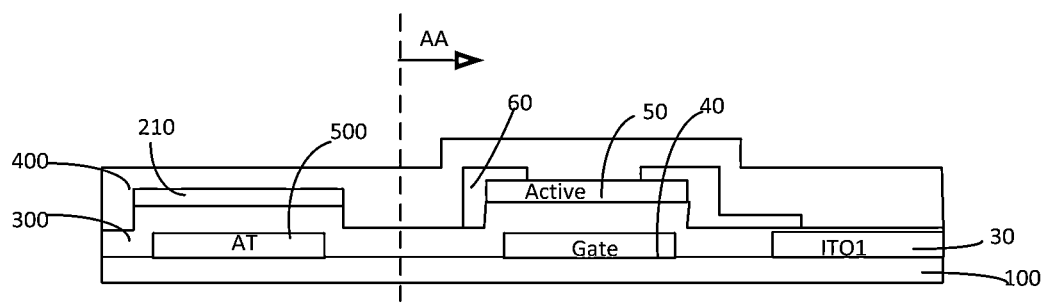
FIG. 26 is a schematic view showing Step S026 in the method for manufacturing the array substrate according to one embodiment of the present disclosure.

Step S026: as shown in FIG. 26, the insulation layer (PVX) 400 may be deposited, and patterns of desired via-holes at the display region (for the connection of circuitries at different metal layers) and the grooves at the peripheral region may be formed through exposing and etching using a fifth mask (PVX mask).

To be specific, the insulation layer 400 may be deposited through magnetron sputtering, thermal evaporation, PECVD or any other film-forming method. The insulation layer 400 may be made of an oxide, a nitride or an oxynitride. To be specific, the insulation layer 400 may be made of SiNx, SiOx or Si(ON)x. The insulation layer 400 may be of a single-layered structure, or a double-layered structure consisting of SiNx and SiOx. Reactive gases corresponding to SiOx may be $SiH_4$ and $N_2O$, and reactive gases corresponding to the nitride or oxynitride may be $SiH_4$, $NH_3$ and $N_2$, or $SiH_2Cl_2$, $NH_3$ and $N_2$. The patterns of via-holes and the grooves may be formed in the insulation layer 400 through dry-etching. To be specific, an organic resin having a thickness of about 4000 Å to 30000 Å may be applied onto the insulation layer 400, and the organic resin may be benzocyclobutene (BCB) or any other organic photosensitive material. After exposing and developing, the via-holes and the grooves may be formed in the insulation layer 400 through a single etching process.

Figure 27:
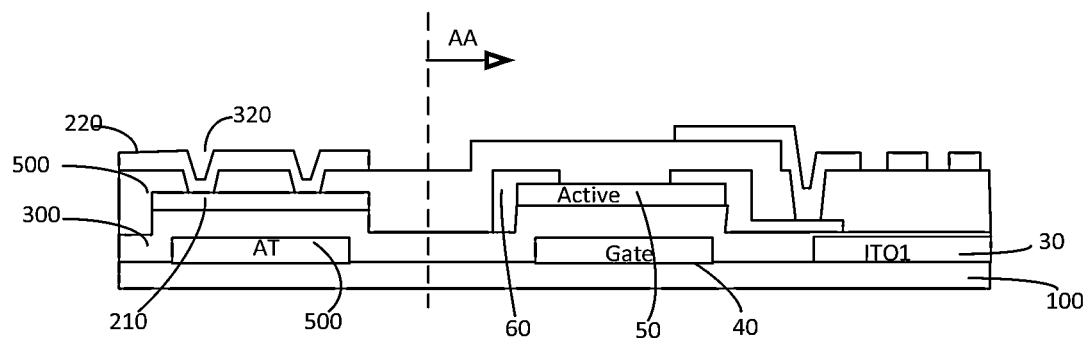
FIG. 27 is a schematic view showing Step S027 in the method for manufacturing the array substrate according to one embodiment of the present disclosure.

Step S027: as shown in FIG. 27, a second ITO pattern at the display region and the light-leakage protection ITO layer 220 at the peripheral region may be formed through exposing and etching using a sixth mask (ITO2 mask). The second ITO pattern at the display region may include a pixel electrode pattern, and the light-leakage protection ITO layer 220 may cover the groove in the insulation layer 400 in a shape-following manner, so as to form a light-shielding hole 320.

To be specific, a second ITO layer may be formed on the base substrate. Next, a photoresist may be applied onto the second ITO layer, and then exposed using the sixth mask, so as to form a photoresist reserved region corresponding to a region where the second ITO pattern and a pattern of the light-leakage protection ITO layer are located and a photoresist unreserved region corresponding to a region other than the patterns. Then, a developing process may be performed, so as to fully remove the photoresist at the photoresist unreserved region and maintain a thickness of the photoresist at the photoresist reserved region. Finally, the second ITO layer at the photoresist unreserved region may be fully etched off through an etching process, and the remaining photoresist may be removed, so as to form the second ITO pattern and the pattern of the light-leakage protection ITO layer.

Some descriptions will be given as follows:

(1) The drawings merely relate to structures involved in the embodiments of the present disclosure, and the other structures may refer to those known in the art.

(2) For clarification, in the drawings for describing the embodiments of the present disclosure, a thickness of a layer or region is zoomed out or in, i.e., these drawings are not provided in accordance with an actual scale. It should be appreciated that, in the case that such an element as layer, film, region or substrate is arranged "on" or "under" another element, it may be directly arranged "on" or "under" the other element, or an intermediate element may be arranged therebetween.

(3) In the case of no conflict, the embodiments of the present disclosure and the features therein may be combined to acquire new embodiments.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. An array substrate, comprising:
a base substrate comprising a display region and a peripheral region surrounding the display region; and
a light-leakage protection film layer formed on the base substrate,
wherein the light-leakage protection film layer is arranged in the peripheral region and comprises at least one first film layer, a light transmittance of each first film layer is smaller than or equal to a first threshold, and reflectivity of each first film layer is smaller than or equal to a second threshold;
wherein an insulation layer is further arranged on the base substrate, a portion of the insulation layer in the peripheral region is arranged between two adjacent first film layers, a plurality of grooves is formed in a side surface of the portion of the insulation layer in the peripheral region distal to the base substrate, and the first film layer at a side of the insulation layer distal to the base substrate covers each groove in a shape-following manner.

2. The array substrate according to claim 1, wherein a plurality of second film layers is arranged at-in the display region, a light transmittance of each second film layer is smaller than or equal to the first threshold, reflectivity of each second film layer is smaller than or equal to the second threshold, and each of the at least one first film layer in the light-leakage protection film layer is arranged in a same layer, and made of a same material, as a respective one of the second film layers.

3. The array substrate according to claim 2, wherein the plurality of second film layers comprises at least one of an active layer or an Indium Tin Oxide (ITO) layer, and at least one first film layer in the light-leakage protection film layer is a light-leakage protection active layer arranged in a same layer, and made of a same material, as the active layer, and/or at least one first film layer in the light-leakage protection film layer is a light-leakage protection ITO layer arranged in a same layer, and made of a same material, as the ITO layer.

4. The array substrate according to claim 3, wherein the ITO layer in the display region comprises a pixel electrode pattern, and at least one light-leakage protection ITO layer in the light-leakage protection film layer is arranged in a same layer, and made of a same material, as the pixel electrode pattern.

5. The array substrate according to claim 4, wherein a buffer layer and an insulation layer are arranged on the base substrate, and the buffer layer, the light-leakage protection active layer, the insulation layer and the light-leakage protection ITO layer are laminated one on another sequentially on the base substrate.

6. The array substrate according to claim 1, wherein the grooves are arranged in the peripheral region in an array form, and a minimum distance c between boundaries of two adjacent grooves is smaller than an inner diameter b of the groove.

7. The array substrate according to claim 6, wherein the minimum distance c between the boundaries of the two adjacent grooves is greater than or equal to 4 µm, and the inner diameter b of the groove is greater than or equal to 5.5 µm.

8. The array substrate according to claim 1, wherein an orthogonal projection of each groove onto the base substrate is of a square shape, a circular shape, a triangular shape or a hexagonal shape.

9. The array substrate according to claim 1, further comprising a metal line arranged in the peripheral region, wherein the light-leakage protection film layer is arranged at a side of the metal line distal to the base substrate to prevent the metal line from reflecting light.

10. A display device, comprising the array substrate according to claim 1, and a color film substrate arranged opposite to the array substrate to form a cell, wherein a black matrix is arranged on the color film substrate and provided with a hollowed-out region at a position corresponding to the peripheral region.

11. The display device according to claim 10, wherein a black matrix mosaic pattern is arranged in the hollowed-out region and comprises a plurality of regular or irregular mosaic blocks arranged in an array form, and two adjacent rows of mosaic blocks are arranged in a staggered manner.

12. The display device according to claim 11, wherein a gap a between the between mosaic blocks is greater than the inner diameter b of the groove.

13. The display device according to claim 10, wherein a plurality of second film layers is arranged in the display region, a light transmittance of each second film layer is smaller than or equal to the first threshold, reflectivity of each second film layer is smaller than or equal to the second threshold, and each of the at least one first film layer in the light-leakage protection film layer is arranged in a same layer, and made of a same material, as a respective one of the second film layers.

14. The display device according to claim 13, wherein the plurality of second film layers comprises at least one of an active layer or an Indium Tin Oxide (ITO) layer, and at least one first film layer in the light-leakage protection film layer is a light-leakage protection active layer arranged in a same layer, and made of a same material, as the active layer, and/or at least one first film layer in the light-leakage protection film layer is a light-leakage protection ITO layer arranged in a same layer, and made of a same material, as the ITO layer.

15. The display device according to claim 14, wherein the ITO layer in the display region comprises a pixel electrode pattern, and at least one light-leakage protection ITO layer in the light-leakage protection film layer is arranged in a same layer, and made of a same material, as the pixel electrode pattern.

16. The display device according to claim 15, wherein a buffer layer and an insulation layer are arranged on the base substrate, and the buffer layer, the light-leakage protection active layer, the insulation layer and the light-leakage protection ITO layer are laminated one on another sequentially on the base substrate.

17. The display device according to claim 10, wherein the array substrate further comprises a metal line arranged in the peripheral region, the light-leakage protection film layer is arranged at a side of the metal line distal to the base substrate to prevent the metal line from reflecting light.

18. The display device according to claim 10, wherein the grooves are arranged in the peripheral region in an array form, and a minimum distance c between boundaries of two adjacent grooves is smaller than an inner diameter b of the groove.

19. A method for manufacturing an array substrate, comprising:
providing a base substrate, the base substrate comprising a display region and a peripheral region surrounding the display region; and
forming a light-leakage protection film layer on the base substrate,
wherein the light-leakage protection film layer is arranged in the peripheral region and comprises at least one first film layer, a light transmittance of each first film layer is smaller than or equal to a first threshold, and reflectivity of each first film layer is smaller than or equal to a second threshold;
wherein the method further comprises:
forming an insulation layer on the base substrate, wherein a portion of the insulation layer in the peripheral region is arranged between two adjacent first film layers, a plurality of grooves is formed in a side surface of the portion of the insulation layer in the peripheral region distal to the base substrate, and the first film layer at a side of the insulation layer distal to the base substrate covers each groove in a shape-following manner.

20. The method according to claim 19, wherein a plurality of second film layers is arranged in the display region, a light transmittance of each second film layer is smaller than or equal to the first threshold, and reflectivity of each second film layer is smaller than or equal to the second threshold, and wherein the forming the light-leakage protection film layer on the base substrate comprises forming the second film layers and the first film layers on the base substrate through a single patterning process.

* * * * *